United States Patent
Frenzel et al.

(10) Patent No.: US 9,030,835 B2
(45) Date of Patent: May 12, 2015

(54) METHOD FOR WELDING A PLASTIC HOUSING

(75) Inventors: Henryk Frenzel, Ragensburg (DE); Volker Müller, Köln (DE)

(73) Assignee: Continental Automotive GmbH (DE)

( * ) Notice: Subject to any disclaimer, the term of this patent is extended or adjusted under 35 U.S.C. 154(b) by 410 days.

(21) Appl. No.: 13/497,282

(22) PCT Filed: Sep. 24, 2010

(86) PCT No.: PCT/DE2010/001121
§ 371 (c)(1), (2), (4) Date: Oct. 31, 2012

(87) PCT Pub. No.: WO2011/035770
PCT Pub. Date: Mar. 31, 2011

(65) Prior Publication Data
US 2013/0050966 A1    Feb. 28, 2013

(30) Foreign Application Priority Data
Sep. 26, 2009 (DE) .......................... 10 2009 043 200

(51) Int. Cl.
*H05K 5/00* (2006.01)
*B29C 65/00* (2006.01)
(Continued)

(52) U.S. Cl.
CPC ............. *B29C 66/9292* (2013.01); *B29C 65/06* (2013.01); *B29C 65/08* (2013.01); *B29C 65/1635* (2013.01);
(Continued)

(58) Field of Classification Search
CPC .................................. H05K 5/00; B32B 37/06
USPC ..................... 156/272.8, 272.6, 273.7, 273.5; 361/759, 752
See application file for complete search history.

(56) References Cited

U.S. PATENT DOCUMENTS 3,989,778 A * 11/1976 Osborne ........................ 264/482
4,631,685 A    12/1986 Peter
(Continued)

FOREIGN PATENT DOCUMENTS

DE    10 2005 00 160 A1    5/2007
DE    10 2009 023 323 A1    12/2009
(Continued)

OTHER PUBLICATIONS

Chinese Office Action corresponding to Chinese Patent Application No. 201080040761.X dated Dec. 3, 2013.
International Search Report for PCT International Application No. PCT/DE2010/001121 mailed Feb. 7, 2011.

*Primary Examiner* — Jayprakash N Gandhi
*Assistant Examiner* — Mandeep Buttar
(74) *Attorney, Agent, or Firm* — RatnerPrestia

(57) ABSTRACT

The main part of the melt produced during laser welding of two housing parts along a circumferential edge is made to flow towards the printed circuit board by a predefined geometry, thus fixing the board in a form-fitting manner. The basic geometry is modified to prevent the melt from distributing in both directions in an uncontrolled manner and make it flow towards the inside of the housing in a targeted manner. The printed circuit board can thus be fixed and the housing sealed in a single operation. Less space is required on the printed circuit board since the support surfaces only affect the peripheral zone of the printed circuit board. The peripheral zone is a barrier zone since the individual printed circuit board is cut out of a panel. Due to the larger contact surface, prestress losses caused by creep of the plastic have no adverse effect.

7 Claims, 4 Drawing Sheets

(51) Int. Cl.
  *B29C 65/16* (2006.01)
  *B60R 16/023* (2006.01)
  *H05K 5/06* (2006.01)
  *B29C 65/06* (2006.01)
  *B29C 65/08* (2006.01)
  *B29C 65/78* (2006.01)
  *B29L 31/34* (2006.01)

(52) U.S. Cl.
  CPC ............ *B29C 65/7829* (2013.01); *B29C 66/32* (2013.01); *B29C 66/322* (2013.01); *B29C 66/3242* (2013.01); *B29C 66/8416* (2013.01); *B29K 2995/0069* (2013.01); *B29L 2031/3425* (2013.01); *B60R 16/0239* (2013.01); *H05K 5/066* (2013.01); *B29C 66/5414* (2013.01); *B29C 65/1654* (2013.01); *B29C 65/1677* (2013.01); *B29C 66/92655* (2013.01)

(56) References Cited

U.S. PATENT DOCUMENTS

| | | | | |
|---|---|---|---|---|
| 4,969,829 | A | * | 11/1990 | Sato .............................. 439/83 |
| 5,199,593 | A | * | 4/1993 | Kita .............................. 220/613 |
| 6,111,760 | A | * | 8/2000 | Nixon ........................... 361/814 |
| 6,380,514 | B1 | * | 4/2002 | Han ............................ 219/125.1 |
| 2007/0063656 | A1 | * | 3/2007 | Wursching et al. ........... 313/634 |
| 2010/0021810 | A1 | * | 1/2010 | Zhu et al. ..................... 429/175 |

FOREIGN PATENT DOCUMENTS

| | | |
|---|---|---|
| FR | 2 657 490 | 7/1991 |
| JP | 61-248729 | 11/1986 |
| JP | 3-150071 | 6/1991 |
| JP | 2004-181533 | 7/2004 |
| WO | WO 00/41321 | 7/2000 |

* cited by examiner

METHOD FOR WELDING A PLASTIC HOUSING

CROSS REFERENCE TO RELATED APPLICATIONS

This application is the U.S. National Phase Application of PCT/DE2010/001121, filed Sep. 24, 2010, which claims priority to German Patent Application No. 10 2009 043 200.0, filed Sep. 26, 2009, the contents of such applications being incorporated by reference herein.

FIELD OF THE INVENTION

The invention relates to a method for welding a plastic housing comprising two housing parts along a circumferential edge of both housing parts, wherein an electronic printed circuit board is arranged in the housing.

BACKGROUND OF THE INVENTION

Plastic housings, in particular of electronic assemblies, such as motor vehicle control units, are nowadays often sealed by welding the plastic parts together, wherein it is particularly preferred to apply the heat energy by means of a laser since, in this way, the heat energy can be applied more precisely to the inner joint between the housing parts and a particularly uniform welding process ensuring a tight seal on all sides can be achieved.

In electronic assemblies, such as motor vehicle control units, a circuit carrier, such as a printed circuit board, is arranged inside the housing, which board must be fixed to a housing half, in particular if acceleration-sensitive sensors that require a suitable rigid mounting to detect the accelerations to be sensed are arranged on said circuit carrier.

From DE 102005000160 A1, which is incorporated by reference, a method and a device for joining two components in a form-fitting manner by means of plastic deformation of one component during a laser welding process is known, wherein a bolt is passed through an opening in the printed circuit board on one side of the housing and said bolt is heated by laser radiation and deformed by pressure so as to form a rivet head. This method requires laser radiation to be applied at two different positions of the housing and openings for the bolt to be provided on the printed circuit board, thus reducing the available surface area of the printed circuit board.

SUMMARY OF THE INVENTION

As aspect of the present invention is to provide a method for welding a plastic housing, which serves to fix the printed circuit board at a particularly low cost, yet securely.

An aspect of the present invention is that the plastic melt produced along a circumferential edge when the two housing parts are welded together reaches a predefined peripheral zone of the printed circuit board, thus fixing the printed circuit board in the housing after cool-down. This means, said fixing is realized by embedding the printed circuit board in a force-fitting and form-fitting manner by means of the plastic of the flowing melt, in a single operation while concurrently sealing the housing and by directing one laser beam directly to the circumferential edge of the housing, thus avoiding the need of deforming additional rivets inside the housing by heating said rivets.

During welding, the housing parts are preferably pressed against each other in order to properly cross-link the two housing parts at the weld and to ensure sufficient flow of the melt.

In addition, pressing of the lid against the printed circuit board and against the lower housing part until the melt has cooled down serves to produce and maintain an adequate clamping effect, thus allowing the printed circuit board to be fixed in a permanent and vibration-free manner.

In order that said fixing ensures a particularly reliable process and to be able to compensate for dimensional tolerances of the plastic parts or the printed circuit board, an excess dimension is provided in the welding area between the housing parts prior to welding and welding is not finished until a predefined deformation path or a predefined counteracting force, preferably the final stop, is reached. The excess dimension is preferably selected in such a manner that, when said excess dimension is reduced, sufficient melt is produced to fix the printed circuit board.

In addition, in one exemplary embodiment, the printed circuit board is preferably placed in one housing part and a projection towards the printed circuit board is provided on the other housing part, which projection reaches the printed circuit board at least at the end of welding, thus holding the printed circuit board in a predefined position during cool-down. In this way, the printed circuit board can be prevented from floating away until the melt has solidified.

At the same time, said projection can be used as a final stop for the deformation path and also define a cavity between the welding area, the projection and the printed circuit board, wherein said cavity is at least partly filled with the melt produced during the welding process.

At least one of the housing parts can be provided with a bevel or a recess, at least in the partial area facing the printed circuit board, thus predefining a preferred direction of flow of the melt towards the printed circuit board.

This method is used to fix an electronic printed circuit board in a plastic housing, preferably exclusively by means of the melt produced during laser welding of the housing along the edge thereof according to this method. Even in case of larger manufacturing tolerances or printed circuit boards of varying thickness, the printed circuit board can be securely fixed and said fixing is suitable for vibration-free mounting of the PCB without additional components (e.g. screws, glue) and is even suitable for the transmission of crash pulses to sensors arranged on the printed circuit board. In parallel, the housing is of course sealed in a water-tight manner.

This means, an aspect of the invention is a new concept for sealing a plastic housing with a lid while, at the same time, fixing a printed circuit board during a welding process, e.g. by means of a laser. The aim is to fix the printed circuit board in such a manner that it can be used for crash sensing.

Aspects of the invention will now be explained in more detail by means of exemplary embodiments and with reference to the figures. Functionally equivalent elements and/or identical elements can hereinafter be provided with the same reference numerals.

It is to be noted that, for the purpose of the invention, it is absolutely irrelevant which of the housing parts is the lid or the lower part and whether the projections discussed below are provided on the lid or the lower part. The only thing that matters with regard to function is their relative position to the printed circuit board.

Furthermore, the exemplary embodiments below always refer to laser welding as the preferred welding method; however, the invention also lends itself to other forms of local welding, such as friction welding, ultrasound welding, etc.

BRIEF DESCRIPTION OF THE DRAWINGS

The invention is best understood from the following detailed description when read in connection with the accompanying drawing. Included in the drawing is the following figure.

DETAILED DESCRIPTION OF THE PREFERRED EMBODIMENTS

Figure 1:
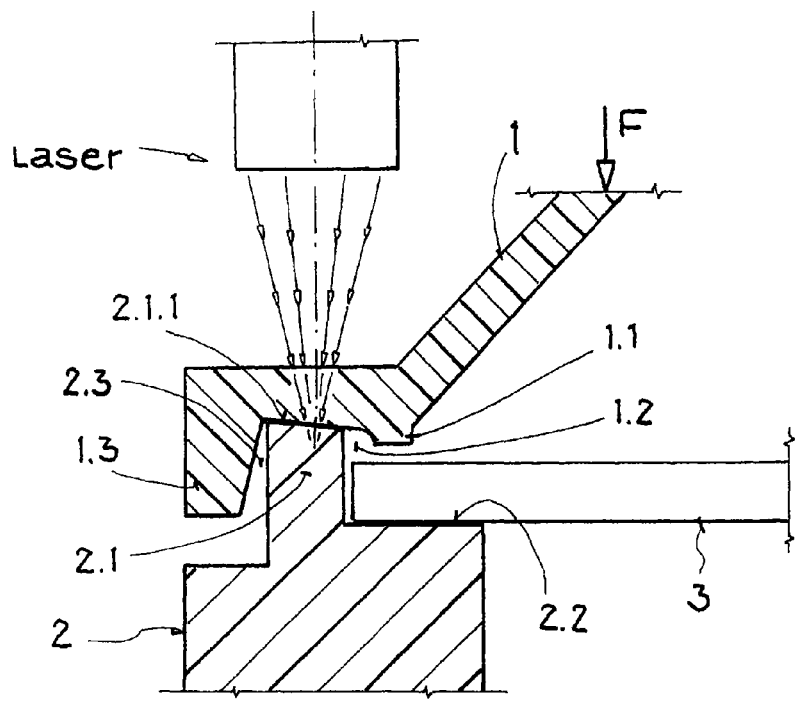
FIG. 1 shows a first exemplary embodiment comprising a housing lid, a lower housing part and a printed circuit board at the beginning of the welding process.

FIG. 1 shows a first exemplary embodiment comprising a housing lid 1, a lower housing part 2 and a printed circuit board 3 at the beginning of the welding process. A projection 1.1 towards the printed circuit board, an outer nose 1.3 towards the outside of the housing and a receiving space 1.2 for the melt, located between the outer nose 1.3 on the lid and a projection 2.1 on the lower housing part, are provided on the lid 1.

The lower housing part 2 comprises a projection 2.1 having an excess dimension, wherein said excess dimension is relative to the outer nose 1.3 and/or relative to the projection 1.1 on the lid and determines a defined material volume of melt, which will be melted during welding and pressed to the side, at least partly, preferably in the greatest part, towards the printed circuit board.

A laser beam penetrates the lid 1 in the place and direction shown in the figure, thus heating the projection 2.1 of the opposite lower housing part 2.

By selecting a suitable material, at least in the area penetrated by the laser, the lid 1 is designed in such a manner that it allows a large part of the laser light to pass through to the surface 2.1.1 of the opposite projection 2.1, where a suitable material selection, e.g. the incorporation of soot particles, etc., ensures particularly high absorption, converting laser light into heat and producing a plastic melt as a result.

Figure 2:
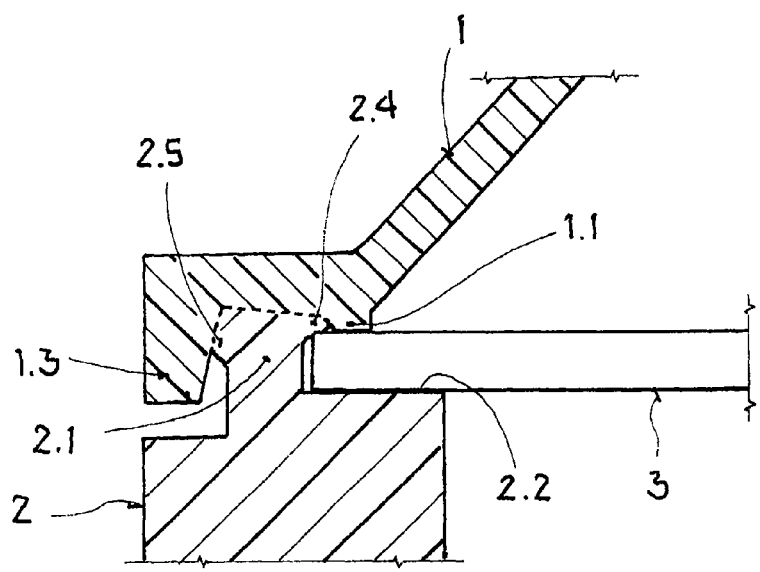
FIG. 2 shows a first exemplary embodiment comprising a housing lid, a lower housing part and a printed circuit board once the welding process is finished.

In this preferred exemplary embodiment, the lid 1 comprises a projection 1.1 towards the printed circuit board 3. Said projection 1.1 is arranged at a distance from the welding zone and from the projection 2.1, which distance defines a cavity 1.2 between the welding area 2.1.1, the projection 1.1 and the printed circuit board 3 prior to welding, wherein said cavity 1.2 is at least partly filled with the melt 2.4 produced during welding, which can be seen particularly well when comparing with FIG. 2.

During welding, the housing parts 1, 2 are pressed against each other and welding is not finished until a predefined counteracting force is reached or a predefined pressing path of the housing parts 1, 2 to each other has been covered. A suitable increase in counteracting force can be achieved in particular by providing a final stop 1.1, 1.3 on one housing part and not finishing welding until the final stop is reached. Said final stop can be provided by the outer nose 1.3 or, preferably, the projection 1.1 facing the printed circuit board.

If the printed circuit board 3 is placed in the lower housing part 2 on the support surface 2.2 and the projection 1.1 reaches the printed circuit board 3 at least at the end of welding, said projection 1.1 can hold the printed circuit board 3 in a predefined position during cool-down and the printed circuit board 3 is prevented from floating or being displaced. In addition, the plastic material will shrink during cool-down, thus even improving clamping and fixation of the printed circuit board 3 in the housing.

A bevel or recess towards the printed circuit board is formed on at least one of the housing parts, at least in the partial area facing the printed circuit board 3, in order to predefine a preferred direction of flow of the melt 2.4 towards the printed circuit board 3. In the first exemplary embodiment according to FIGS. 1 and 2, the upper surface 2.1.1 of the projection 2.1 is beveled over its entire surface area and the opposite surface on the lid 1 preferably has a corresponding beveled design for this purpose. This results in a transverse force when the lid 1 is pressed against the liquefied melt, which force is directed into the cavity 1.2 that is preferably filled with the melt 2.4. In addition, grooves or similar recesses can be provided on the lid 1 or the projection 2.1, which also allow the melt to flow off at a similar rate.

Figure 3:
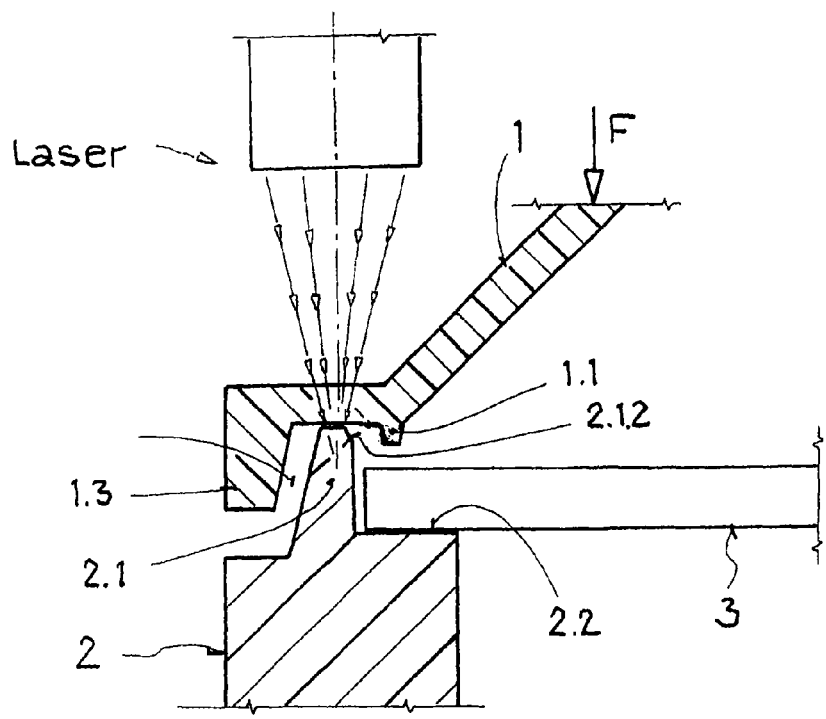
FIG. 3 shows a second exemplary embodiment comprising a housing lid, a lower housing part and a printed circuit board at the beginning of the welding process.
Figure 4:
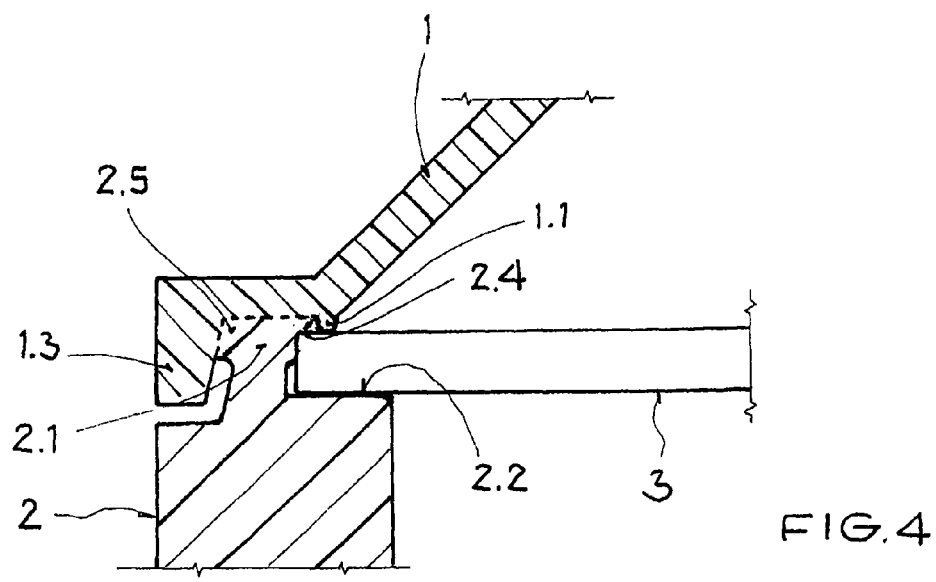
FIG. 4 shows a second exemplary embodiment comprising a housing lid, a lower housing part and a printed circuit board once the welding process is finished.

FIGS. 3 and 4 show a modified second exemplary embodiment, where part of the melt is made to flow into a receiving space 2.3 in a targeted manner. Said melt 2.5 that has flown off to the outside of the housing additionally fixes the outer nose 1.3 to the projection 2.1, thus sealing the housing over a wide surface area.

Figure 5:
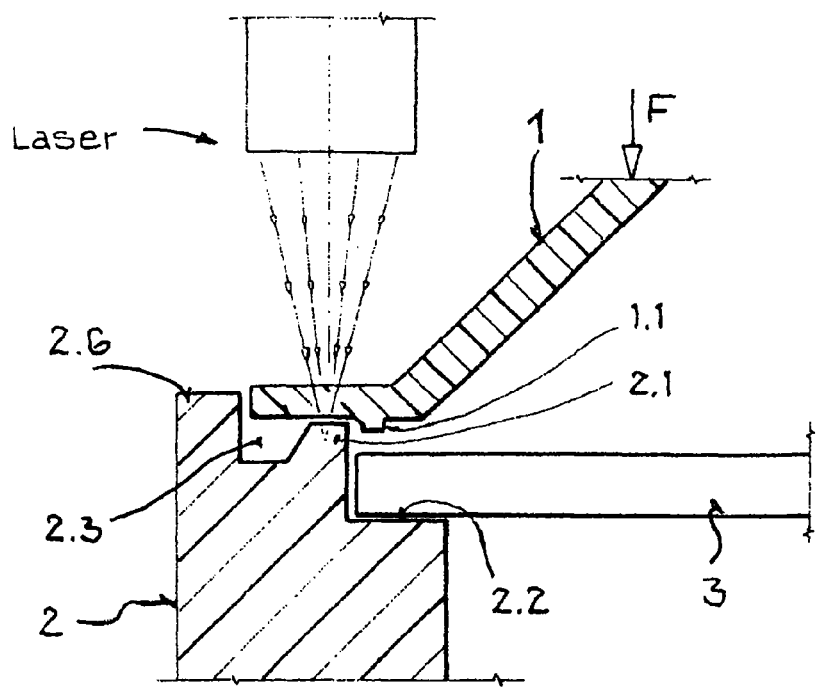
FIG. 5 shows another exemplary embodiment at the beginning of the welding process.
Figure 6:
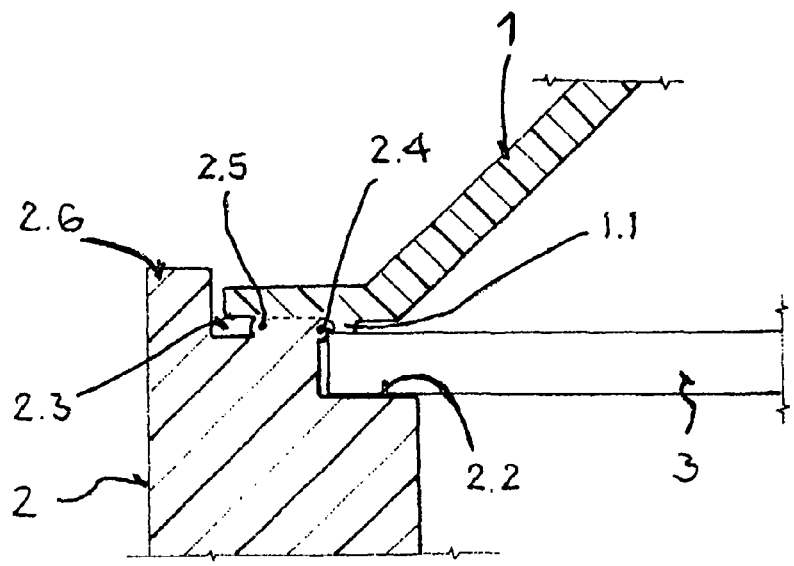
FIG. 6 shows an exemplary embodiment according to FIG. 5 once the welding process is finished.

FIGS. 5 and 6 show another exemplary embodiment. The lower housing part 2 comprises a projection 2.1 having an excess dimension, wherein said excess dimension is relative to the outer nose 1.3 and/or relative to the projection 1.1 on the lid and determines a defined material volume of melt, which will be melted during welding. A laser beam penetrates the lid 1 in the place and direction shown in the figures, thus heating the projection 2.1 of the opposite lower housing part 2.

By selecting a suitable material, at least in the area penetrated by the laser, the lid 1 is designed in such a manner that it allows a large part of the laser light to pass through to the surface 2.1.1 of the opposite projection 2.1, where a suitable material selection, e.g. the incorporation of soot particles, etc., ensures particularly high absorption, converting laser light into heat and producing a plastic melt as a result.

The lid 1 comprises a projection 1.1 towards the printed circuit board 3. During welding, the housing parts 1, 2 are pressed against each other and welding is not finished until a predefined counteracting force is reached or a predefined pressing path of the housing parts 1, 2 to each other has been covered. A suitable increase in counteracting force is achieved when the projection 1.1 contacts the printed circuit board 3, thus prestressing the lid 1.

If the printed circuit board 3 is placed in the lower housing part 2 on the support surface 2.2 and the projection 1.1 reaches the printed circuit board 3 at least at the end of welding, said projection 1.1 can hold the printed circuit board 3 in a predefined position during cool-down and the printed circuit board 3 is prevented from floating or being displaced. In addition, the plastic material will shrink during cool-down, thus even improving clamping and fixation of the printed circuit board 3 in the housing.

An outer nose 2.6, formed on the lower housing part here, provides additional protection of the weld against objects acting directly thereon.

It is to be stressed once again that the amount of melt which is produced and made to flow off as a result of pressing is much higher than in conventional welding methods and that a purposeful removal of material and reduction of the excess dimension take place on the projection 2.1.

As described above, the main part of the melt produced during welding is made to flow towards the printed circuit board by means of a predefined geometry, thus fixing said board in a form-fitting manner. In addition, the printed circuit board is fixed in the housing in a force-fitting manner by means of stops arranged on the lid. The joining path depends on the thickness of the printed circuit board, due to the stops. It is for example 0.4-0.8 mm.

The present invention is based on the known laser welding process used for plastics. The basic geometry predefined for said process has been modified to prevent the melt from distributing in both directions in an uncontrolled manner but make it flow towards the interior of the housing.

The advantage of this concept is that the printed circuit board can be fixed and the housing sealed in a single operation and with just one laser beam directed to the circumferential edge. In addition, the printed circuit board is fixed on a much larger surface area than in conventional hot-gas riveting while less space is required on the printed circuit board since the support surfaces only affect the peripheral zone of the printed circuit board. Said peripheral zone, however, is defined as a barrier zone since the individual printed circuit board is cut out of a panel.

Due to the larger contact surface, prestress losses caused by creep of the plastic have no adverse effect.

In addition to the advantages mentioned above, this method ensures a very reliable process since the welding path is preferably controlled using a force analysis. This means, the welding process can be stopped when the prestressing force increases (once the stops contact the printed circuit board) without putting too much strain on the printed circuit board.

Figure 7:
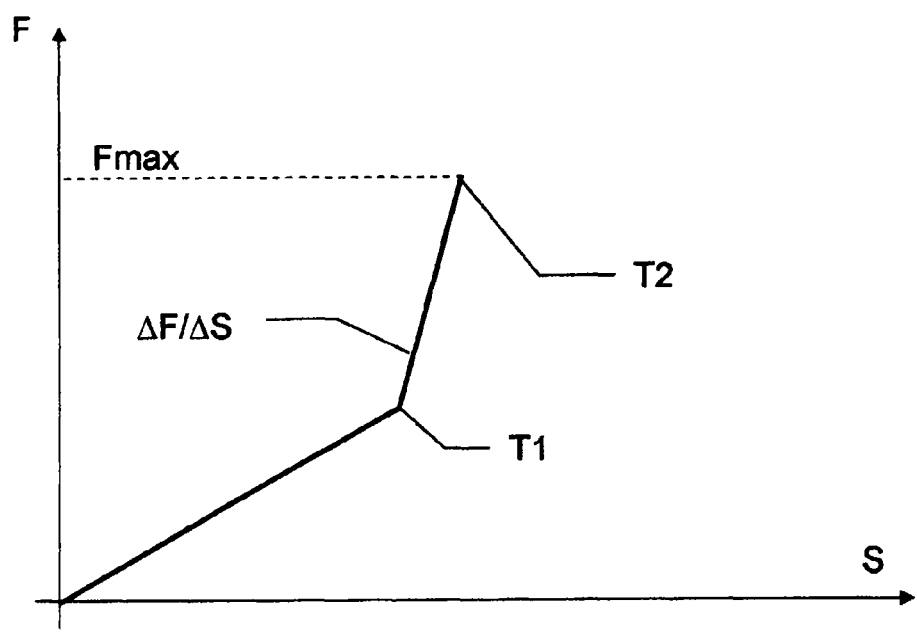
FIG. 7 shows a force curve.

FIG. 7 shows a typical force curve along the displacement path s of the lid relative to the printed circuit board, with a sharp increase in the counteracting force when the printed circuit board is reached at T1, which activates shut-off at T2. This means, a counteracting force Fmax can be predefined for shut-off, which force is dimensioned to ensure an adequate clamping effect between the printed circuit board and the lid. As an alternative, the change in increase, i.e. the relative change of the force along the displacement path, $\Delta F/\Delta S$, or over time, $\Delta F/\Delta T$, can be taken into account.

In addition, welding of a lid requires much less material than resin casting of the printed circuit board. A welding process saves not just material, compared to resin casting, but also considerable time since the welded joint cools down more quickly and need not dry.

Electrical contact of the printed circuit board can be made in the conventional manner, with press-fit inserts, as well as using single pins or direct connections.

What is critical is that the printed circuit board is fixed and the housing is sealed along the edge of the housing during the welding process.

LIST OF REFERENCE NUMERALS

1 Lid
1.1 Projection on the lid, towards the printed circuit board
1.2 Receiving space for melt between the projection on the lid and a projection on the lower housing part, towards the lid
1.3 Outer nose on the lid
2 Lower housing part
2.1 Projection on the lower housing part, towards the lid
2.1.1 Upper surface of the projection 2.1
2.1.2 Flow-off phase on the projection 2.1
2.2 Support surface for the printed circuit board
2.3 Receiving space, towards the outside of the housing, for excess melt
2.4 Melt that has flown off towards the printed circuit board and solidified
2.5 Melt that has flown off towards the outside of the housing
2.6 Outer nose on the lower housing part
3 Printed circuit board
F Force
S Displacement path

The invention claimed is:

1. A method for welding a plastic housing, comprising two housing parts, along a circumferential edge of both housing parts, wherein an electronic printed circuit board is arranged in the housing, the method comprising:
   a) pressing the housing parts against each other, one of the housing parts having a projection extending toward the electronic printed circuit board, the projection forming a cavity between the projection and an area to be welded;
   b) producing a plastic melt by welding with a laser beam, in the area to be welded, the area positioned along the circumferential edge of both housing parts, the plastic melt extending into the cavity to contact a peripheral zone of the printed circuit board; and
   c) continuing welding until a predefined counteracting force is reached or a predefined pressing path of the housing parts to each other has been covered.

2. A method according to claim 1, wherein the printed circuit board is placed in one housing part and the projection towards the printed circuit board is provided on the other housing part, the projection reaches the printed circuit board at the end of welding and holds the printed circuit board in a predefined position during cool-down.

3. A method according to claim 2 wherein the projection towards the printed circuit board is arranged at a predefined distance from the welding area.

4. A method according to claim 1, further comprising forming a bevel or a recess towards the printed circuit board on at least one of the housing parts, at least in a partial area facing the printed circuit board, in order to predefine a preferred direction of flow of the melt towards the printed circuit board.

5. An electronic assembly consisting of a plastic housing comprising two housing parts, wherein an electronic printed circuit board is arranged in the housing and said board is fixed by melting according to the method of claim 1.

6. A method according to claim 1, further comprising providing a final stop on one housing part and welding is not finished until the final stop is reached.

7. A method for welding a plastic housing, comprising two housing parts, along a circumferential edge of both housing parts, wherein an electronic printed circuit board is arranged in the housing, the electronic printed circuit board having a side surface and opposed upper and lower surfaces, the method comprising:
   a) pressing the housing parts against each other, one of the housing parts having a projection extending toward the electronic printed circuit board, the projection forming a cavity between the projection and an area to be welded, the cavity defined in part by at least one of the upper and lower surfaces of the electronic printed circuit board;
   b) producing a plastic melt by welding with a laser beam, in the area to be welded, the area positioned along the circumferential edge of both housing parts, the plastic melt extending into the cavity to contact the at least one of the upper and lower surfaces of the electronic printed circuit board; and c) continuing welding until a predefined counteracting force is reached or a predefined pressing path of the housing parts to each other has been covered.

* * * * *